US008768899B2

(12) United States Patent
Faerber et al.

(10) Patent No.: US 8,768,899 B2
(45) Date of Patent: Jul. 1, 2014

(54) COMPRESSION OF TABLES BASED ON OCCURRENCE OF VALUES

(75) Inventors: Franz Faerber, Walldorf (DE); Guenter Radestock, Karlsruhe (DE); Andrew Ross, Altrip (DE)

(73) Assignee: SAP AG, Walldorf (DE)

( * ) Notice: Subject to any disclaimer, the term of this patent is extended or adjusted under 35 U.S.C. 154(b) by 0 days.

(21) Appl. No.: 13/356,567

(22) Filed: Jan. 23, 2012

(65) Prior Publication Data

US 2012/0124019 A1      May 17, 2012

Related U.S. Application Data

(63) Continuation of application No. 13/219,499, filed on Aug. 26, 2011, now Pat. No. 8,126,855, which is a continuation of application No. 11/805,178, filed on May 21, 2007, now Pat. No. 8,032,499.

(51) Int. Cl.
*G06F 17/30*      (2006.01)

(52) U.S. Cl.
USPC ........................................................ 707/693

(58) Field of Classification Search
USPC ........................................................ 707/693
See application file for complete search history.

(56) References Cited

U.S. PATENT DOCUMENTS

| 5,523,946 | A | 6/1996 | Kaplan et al. |
| 5,574,906 | A | 11/1996 | Morris |
| 5,870,036 | A | 2/1999 | Franaszek et al. |
| 6,112,208 | A | 8/2000 | Ikegami |
| 6,529,912 | B2 | 3/2003 | Satoh et al. |
| 6,711,563 | B1 * | 3/2004 | Koskas .......................... 707/769 |
| 2002/0099691 | A1 * | 7/2002 | Lore et al. .......................... 707/2 |
| 2003/0135495 | A1 * | 7/2003 | Vagnozzi .......................... 707/3 |
| 2004/0034616 | A1 * | 2/2004 | Witkowski et al. ............... 707/1 |
| 2005/0187962 | A1 * | 8/2005 | Grondin et al. ............... 707/102 |
| 2005/0192998 | A1 | 9/2005 | Dittrich et al. |
| 2008/0275847 | A1 | 11/2008 | Chellapilla et al. |

OTHER PUBLICATIONS

Abadi et al. Integrating Compression and Execution in Column-Oriented Database Systems, 2006 ACM.*
Ian H. Witten, Alistair Moffat, and Timothy C. Bell, *Managing Gigabytes: Compressing and Indexing Documents and Images*, San Francisco: Morgan Kaufmann Publishing, 1999.
Navneet Goyal, et al., "Improved Bitmap Indexing Strategy for Data Warehouses", ICIT '06, 9th International Conference on Information Technology, Dec. 18-21, 2006, Bhubaneswar, India, IEEE, Piscataway, NJ, USA, Dec. 1, 2006, pp. 213-216.

(Continued)

*Primary Examiner* — Kevin L Young
(74) *Attorney, Agent, or Firm* — Mintz Levin Cohn Ferris Glovsky and Popeo, P.C.

(57) ABSTRACT

Methods and apparatus, including computer program products, for compression of tables based on occurrence of values. In general, a number representing an amount of occurrences of a frequently occurring value in a group of adjacent rows of a column is generated, a vector representing whether the frequently occurring value exists in a row of the column is generated, and the number and the vector are stored to enable searches of the data represented by the number and the vector. The vector may omit a portion representing the group of adjacent rows. The values may be dictionary-based compression values representing business data such as business objects. The compression may be performed in-memory, in parallel, to improve memory utilization, network bandwidth consumption, and processing performance.

12 Claims, 10 Drawing Sheets

(56) References Cited

OTHER PUBLICATIONS

Legler, T., et al., "Data Mining with the SAP Net Weaver BI Accelerator", VLDB '06, Proceedings of the 32nd International Conference on Very Large Data Bases, Sep. 12, 2006, pp. 1059-1068, Retrieved from the Internet: <URL:http://delivery.acm.org/10.1145/1170000/1164218/p1059-legler.pdf?ip=145.64.134.245&CFID=34433516&CFTOKEN=66219892&_acm_=1312534710_ae5bc043e1e47af00f7acd0989c7fa4e>, retreived on Aug. 5, 2011.
Examination Report dated Aug. 12, 2011, issued by the European Patent Office in connection with corresponding European Patent Application No. 08005176.6-222e.
Extended European Search Report (EESR) dated Jun. 8, 2009, issued by the European Patent Office in connection with European patent application No. 08008447.8-1247.
Salomon, David, "Data Compression: The Complete Reference, 3rd Edition," Springer Verland, New York, USA, 2004 (pp. 168-171).
Stonebraker, Mike et al., "C-Store: A column-oriented DBMS," VLDB Proc. Int. Conference Large Data Bases: VLDB 2005—Proceedings of 31st International Conference on Very Large Data Bases 2005, vol. 2, 2005, pp. 553-564.
Pinar, A et al.. "Compressing Bitmap Indices by Data Reogranization," Data Engineering, 2005. ICDE 2005 Proceedings, 21st International Conference on Tokyo, Japan Apr. 5-8, 2005, Piscataway, NJ, IEEE, Apr. 5, 2005 p. 310-321.
Wen-jann Yang et al., "Parallel intersecting compressed bit vectors in a high speed query server for processing postal addresses," High-Performance Computer Architecture 1996, Proceedings Second International Symposium on San Jose, CA, Feb. 3-7, 1996, Los Alamitos, IEEE Comput. Soc. US Feb. 3, 1996, p. 232-241.
Wu, K et al., "Optimizing bitmap indices with efficient compression," ACM Transactions on Database Systems ACM, USA, vol. 31, No. 1, Mar. 2006, p. 1-38.
Abadi, Daniel et al., "Integrating compression and execution in column-oriented database systems," Proc. ACM Sigmod Int. Conf. Manage. Data; Proceedings of the ACM Sigmod International Conference on Management of Data; Sigmod 2006, p. 671-682.
Communication, Aug. 5, 2008, Application No. 080051766-223.
Guadalupe Canahuate, et al., "Improving Bitmap Index Compression by Data Reorganization", IEEE Transactions on Knowledge and Data Engineering, Manuscript, Aug. 24, 2006, pp. 1-35.

\* cited by examiner

180 → RETURN TOTAL REVENUE FOR IBM SALES

182 → >> RETURN TOTAL REVENUE FOR:
　　　　[ROWS WITH VID = 3 FROM MAIN INDEX]
186 → +/-
184 → [ROWS WITH VID = 4 FROM DELTA INDEX]

FIG. 1C

| Column | Cardinality | # Bits |
|---|---|---|
| $M_1$ | 24 | 5 |
| $M_2$ | 5089 | 13 |
| $M_3$ | 3 | 2 |
| $M_4$ | 12 | 4 |
| $M_5$ | 5 | 3 |
| $M_6$ | 51 | 6 |
| $M_7$ | 662 | 10 |
| $Kf_1$ | 2885 | 12 |
| $Kf_2$ | 5029 | 13 |
|  | Sum | 68 |

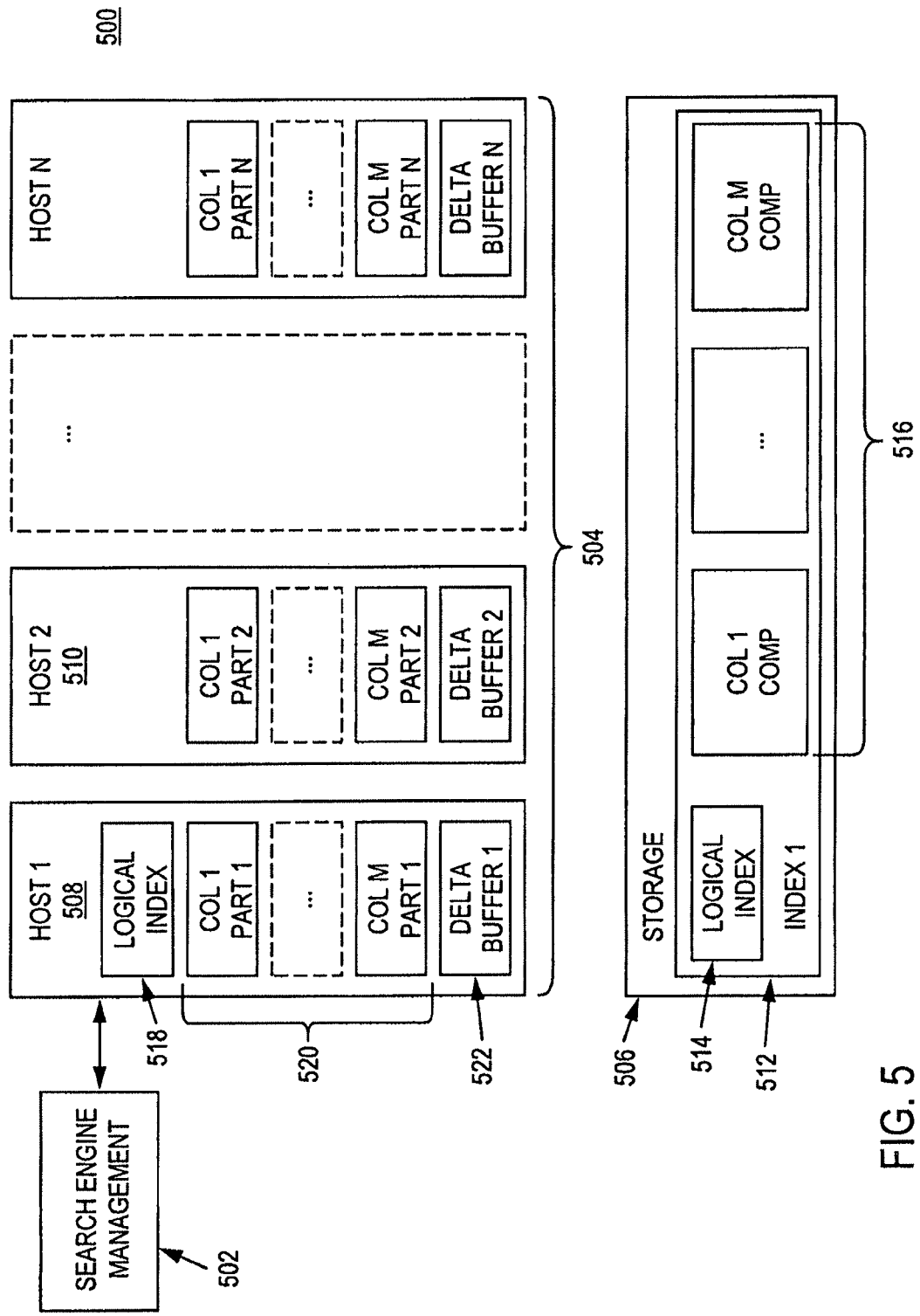

| | A_1 | A_2 | A_3 | A_4 | A_5 | A_6 | A_7 | A_8 | A_9 |
|---|---|---|---|---|---|---|---|---|---|
| 01 | 0 | 0 | 0 | 0 | 0 | 0 | 0 | 0 | 0 |
| 02 | 0 | 0 | 0 | 0 | 0 | 0 | 0 | 0 | 0 |
| 03 | 0 | 0 | 0 | 0 | 0 | 0 | 0 | 0 | 1 |
| 04 | 0 | 0 | 0 | 0 | 0 | 0 | 0 | 0 | 1 |
| 05 | 0 | 0 | 0 | 0 | 0 | 0 | 0 | 6 | 5 |
| 06 | 0 | 0 | 0 | 0 | 0 | 0 | 0 | 5 | 4 |
| 07 | 0 | 0 | 0 | 0 | 0 | 1 | 4 | 4 | 2 |
| 08 | 0 | 0 | 0 | 0 | 4 | 2 | 5 | 0 | 2 |
| 09 | 0 | 0 | 0 | 3 | 3 | 0 | 3 | 0 | 0 |
| 10 | 0 | 0 | 4 | 4 | 5 | 0 | 0 | 3 | 0 |
| 11 | 0 | 4 | 5 | 2 | 6 | 4 | 2 | 2 | 3 |
| 12 | 0 | 2 | 0 | 2 | 0 | 3 | 1 | 1 | 0 |
| 13 | 0 | 1 | 3 | 2 | 3 | 2 | 2 | 2 | 3 |
| 14 | 0 | 1 | 0 | 0 | 0 | 5 | 0 | 3 | 1 |
| 15 | 0 | 3 | 1 | 0 | 2 | 0 | 5 | 4 | 1 |
| 16 | 1 | 0 | 0 | 1 | 1 | 1 | 5 | 3 | 4 |
| 17 | 2 | 0 | 2 | 2 | 2 | 1 | 0 | 0 | 4 |
| 18 | 0 | 1 | 2 | 2 | 3 | 1 | 4 | 1 | 5 |
| 19 | 0 | 0 | 0 | 0 | 0 | 0 | 0 | 0 | 0 |
| 20 | | | | | | | | | |
| 21 | | | | | | | | | |
| S0 | 19 | 16 | 16 | 13 | 12 | 12 | 12 | 9 | 8 |

FIG. 6

COMPRESSION OF TABLES BASED ON OCCURRENCE OF VALUES

CROSS REFERENCE TO RELATED APPLICATIONS

This application is a continuation application of U.S. patent application Ser. No. 13/219,499, filed Aug. 26, 2011, now U.S. Pat. No. 8,126,855 and entitled "COMPRESSION OF TABLES BASED ON OCCURRENCE OF VALUES", which in turn is a continuation application of U.S. patent application Ser. No. 11/805,178, filed on May 21, 2007, now U.S. Pat. No. 8,032,499 and entitled "COMPRESSION OF TABLES BASED ON OCCURRENCE OF VALUES", and the contents of both applications are hereby fully incorporated by reference.

BACKGROUND

The present disclosure relates to data processing by digital computer, and more particularly to compression of tables based on occurrence of values.

Search engines may search large amounts of data in database tables, such as relational tables, to find results. For massive amounts of data, such as a combination of tables containing millions of records, processing of the data may require lots of hardware resources. For example, large amounts of random access memory space may be needed to store all the records that are relevant to executing a user request.

SUMMARY

The subject matter disclosed herein provides methods and apparatus, including computer program products, that implement techniques related to compression of tables based on occurrence of values.

In one aspect, columns of dictionary-based compression values are generated, the columns are sorted, at least one bit vector is generated for at least one of the columns, a number representing occurrences of a most-frequently occurring value of at least one of the columns is generated, most-frequently occurring values are removed from the bit vector, and, the numbers and the bit vectors are stored to enable in-memory searches of the data represented by each of the numbers and the bit vectors. The columns of dictionary-based compression values may be based on a dictionary of possible values for each column of a column-based database and the values may represent structured business data. The sorting may include sorting the columns such that a first column ordered first in an ordering of the columns has a most-frequently occurring value of the first column occurring more frequently than frequently-occurring values of other columns. Sorting may further include sorting the first column such that instances of the most-frequently occurring value of the first column are at one end of the first column and sorting the other columns such that instances of most-frequently occurring values of at least one of the other columns are towards ends of the respective other columns. Each of the bit vectors may represent most-frequently occurring values of a respective column, where each bit represents whether a most-frequently occurring value exists.

In a related aspect, at least one bit vector corresponding to a most-frequently occurring value of a column of data is generated for at least one of the columns, at least one number representing occurrences of the most-frequently occurring value of the column is generated, most-frequently occurring values are removed from the at least one bit vector, and, the number and the at least one bit vector are stored to enable searches of the data represented by the number and the bit vector. Each bit of the vector may represent whether a value is instantiated at the corresponding place in the column.

In a related aspect, a number representing an amount of occurrences of a frequently occurring value in a group of adjacent rows of a column is generated, a vector representing places at which the frequently occurring value is instantiated in a row of the column is generated, and the number and the vector are stored to enable searches of the data represented by the number and the vector. The vector may omit a portion representing the group of adjacent rows.

The subject matter may be implemented as, for example, computer program products (e.g., as source code or compiled code tangibly embodied in computer-readable media), computer-implemented methods, and systems.

Variations may include one or more of the following features.

Values of columns may be values representing structured business data, which may have data dependencies across a same row of a table. The business data may include business objects, which may be modeled as sets of joined tables.

Actions may be performed in parallel on multiple hardware servers. For example, rows may be distributed across a number of servers and each server may be responsible for compressing data in its rows.

Frequently occurring values corresponding to a vector, such as a most-frequently occurring value corresponding to a bit vector, may be removed from a column to generate a reduced column. A reduced column may be stored in lieu of a column.

Bit vectors may be generated for each of the columns, for all of the columns, or for any subset of the set of columns.

Changes to values of a column may be stored in a delta buffer separate from the column and the changes may be integrated asynchronously.

The subject matter described herein can be implemented to realize one or more of the following advantages. Efficient processing of mass amounts of database data, such as relational tables containing mass amounts of data, may require a high level of data compression to retain data volumes in installed memory (e.g., volatile memory) or on disk storage devices, and for efficient data flows when moving the data (e.g., from a hard disk drive to memory). Compression may have multiple effects in an information processing hardware landscape because reduced data volumes may require less installed main memory or hard disk capacity, and reduced data flows may place lower demands on processor cache, processor architectures, and on network bandwidth. All this may have a beneficial effect on hardware requirements, response times, and overall system performance. Data, such as business data, may be compressed and searched in memory, as significant compression of the data may allow for cost-effective in-memory processing of the data (e.g., a number of servers or amount of physical memory may be reduced). A delta buffer may be used for asynchronous updates of the data and the delta buffer may assist in enabling index updates to be scheduled to run at times which do not hamper performance of searches (e.g., a system may be employed in scenarios where asynchronous, infrequent updates are preferred as a trade-off against improved response time for searching). A combination of compression techniques may be implemented, which may provide beneficial memory cost reduction depending on a scenario. For example, dictionary-based compression might only be performed for a column if expected to reduce a memory footprint of that column, while vector-based compression may be performed for other columns where the compression is expected to reduce a memory footprint.

Details of one or more implementations are set forth in the accompanying drawings and in the description below. Further features, aspects, and advantages will become apparent from the description, the drawings, and the claims.

BRIEF DESCRIPTION OF THE DRAWINGS

FIG. 1C is an example illustrating generation of result sets from main and delta indexes.

FIG. 5 is a block diagram illustrating a system to compress data and search compressed data.

FIG. 6 is a block diagram of a table illustrating a sorting of data across multiple columns.

Like reference numbers and designations in the various drawings indicate like elements.

DETAILED DESCRIPTION

In general, in FIGS. 1-7, data may be compressed using a combination of techniques, which may be referred to as dictionary-based compression, bit vector compression (or, vector-based compression), and sorting bit vector compression (or, shortened vector-based compression). The data may be structured business data, where the data is structured in the sense that data may be attributes or key figures which are organized in a data structure, such as a table, and attributes or key figures may have dependencies. For example, in a table of information, a row may have dependencies among data in the row such that data in each of the columns of the row is associated with other data in other columns of the row. The data may form a sparse distribution in the sense that particular values such as null values of data may be instantiated exceedingly often across thousands or millions of rows either in part of the data structure, such as in certain rows in a table, or across the entire data structure. For example, a column of data having twenty million entries may include nineteen million null entries, where the nineteen million null entries are located in various rows that are not necessarily adjacent.

Figure 1A:
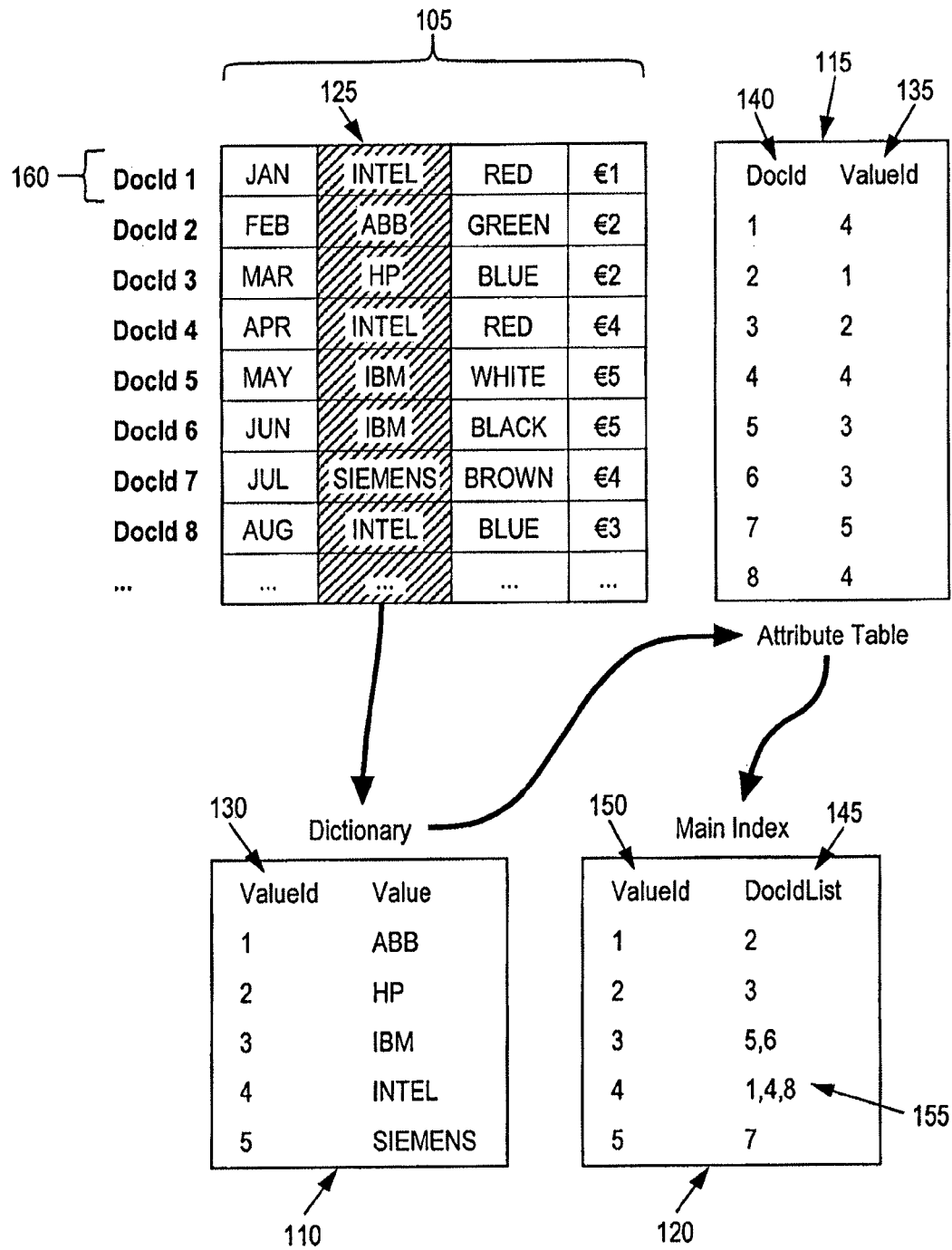
FIG. 1A is a block diagram illustrating a table of structured data, a dictionary for a column of the table, an attribute table, and a main index.

FIG. 1A is a block diagram illustrating a table 105 of structured data, a dictionary 110 for a column of the table, an attribute table 115, and an index 120. In general, FIG. 1A illustrates how a column 125 in the table 105 may be provided with the dictionary 110 that specifies value identifiers 130 (ValueIds) for the values in the column 125, the attribute table 115 listing value identifiers 135 for respective document identifiers 140 (DocIds), and the index 120 listing document identifiers 145 for respective value identifiers 150.

The dictionary 110 may be used to provide what may be referred to as dictionary-based compression, which may involve using the dictionary 110 to reduce an amount of data stored in a table by representing values in the table with identifiers that may take up less memory. In general, the dictionary 110 is a list, which may be sorted, of values appearing in a column and identifiers of the values (i.e., the value identifiers).

As an example, to reduce the memory or disk space occupied by a column from a data table by means of dictionary-based compression, a sorted list of different values appearing in a column may be generated and the different values may be numbered. The numbers (implemented, for example, as integers rather than strings that may represent the values themselves) may be used as placeholders for the values in the tables where the values appeared. The largest numbers needed to represent the values may be noted. If the cardinality C of a column is defined to be the number of different values appearing in it and if the total length of the column is N, then in a case where the value of C is much less than N, dictionary-based compression may bring benefits, such as reduced memory consumption in contrast to storing of the values in the table. A sorted list of C values may be referred to as a dictionary and may be used to look up the values of the numbers appearing in the table whenever these values need to be determined, for example, to return readable results to a user.

For example, the table 105 includes a column 125, which has values such as INTEL, ABB, and HP. The dictionary 110 includes value identifiers 120, which may represent the different values that may be in the column 125. For example, the attribute table 115 includes a value identifier for each row of the column 125. For example, the first row 160, referred to as document identifier 1 ("DocId 1"), includes a value INTEL that is represented in the attribute table 115 with the value identifier 4 based on the dictionary 110 having the value identifier 4 associated with the value INTEL. Values of the column 125 of the table 105 may be replaced with the value identifiers of the attribute table 115, which may reduce memory footprint of the data represented by the column 125. The value identifiers in the new table, along with the dictionary 110 may be used to reconstruct to the values of the column 125.

To facilitate value lookup and thus render contents of the column in a form that is more adapted for query execution, the index 120 may be generated and that index may replace the column 125. The index 120 is a table of lists of rows of the column 125 organized by their value identifier. For example, one list 155 indicates that a fourth value identifier is associated with rows 1, 4, and 8 of the column 125.

As an example of a memory impact of a table, a number of rows in a table T, such as the table 105 of FIG. 1A, may be equal to N being 1,000,000; and a number of bytes required to code each row may be 500, where 500 bytes is equal to 4,000 bits, which is equal to 4 kilobits. Without compression, the table T may require 1,000,000 times 500 bytes of space, which is equivalent to 500 megabytes of memory space; and, bandwidth required to move the table T in one second may be 4 gigabits per second.

As an example of how the data may be organized, a number of different values in column A of table T may be equal to a cardinality C of A being 250. In that example, the dictionary for column A may be a list of C values numbered by integers from 0 to 250. The binary representation of integers up to 250 may require eight bits (since two to the eighth power is equal to 256) which is one byte. For an example table T consisting of ten columns similar to column A, an average uncompressed column entry in any column occupies fifty bytes (500 bytes divided by ten columns is fifty bytes per column). The dictionary for column A may require about 100 kilobits (from the fact that 250 entries×(1 one byte value identifier plus 50 bytes to represent the corresponding value in a dictionary entry) is about 12 kilobytes, which is about 100 kilobits). Thus, with dictionary-based compression, column A may occupy 1,000,000 bytes, which is about one megabyte with a total space required by column A with dictionary-based compression being about 1.01 megabyte (space of compressed column plus corresponding dictionary); whereas a nominal space occupied by column A without compression may be 50 megabytes. So the compression factor may be about 50.

Figure 1B:
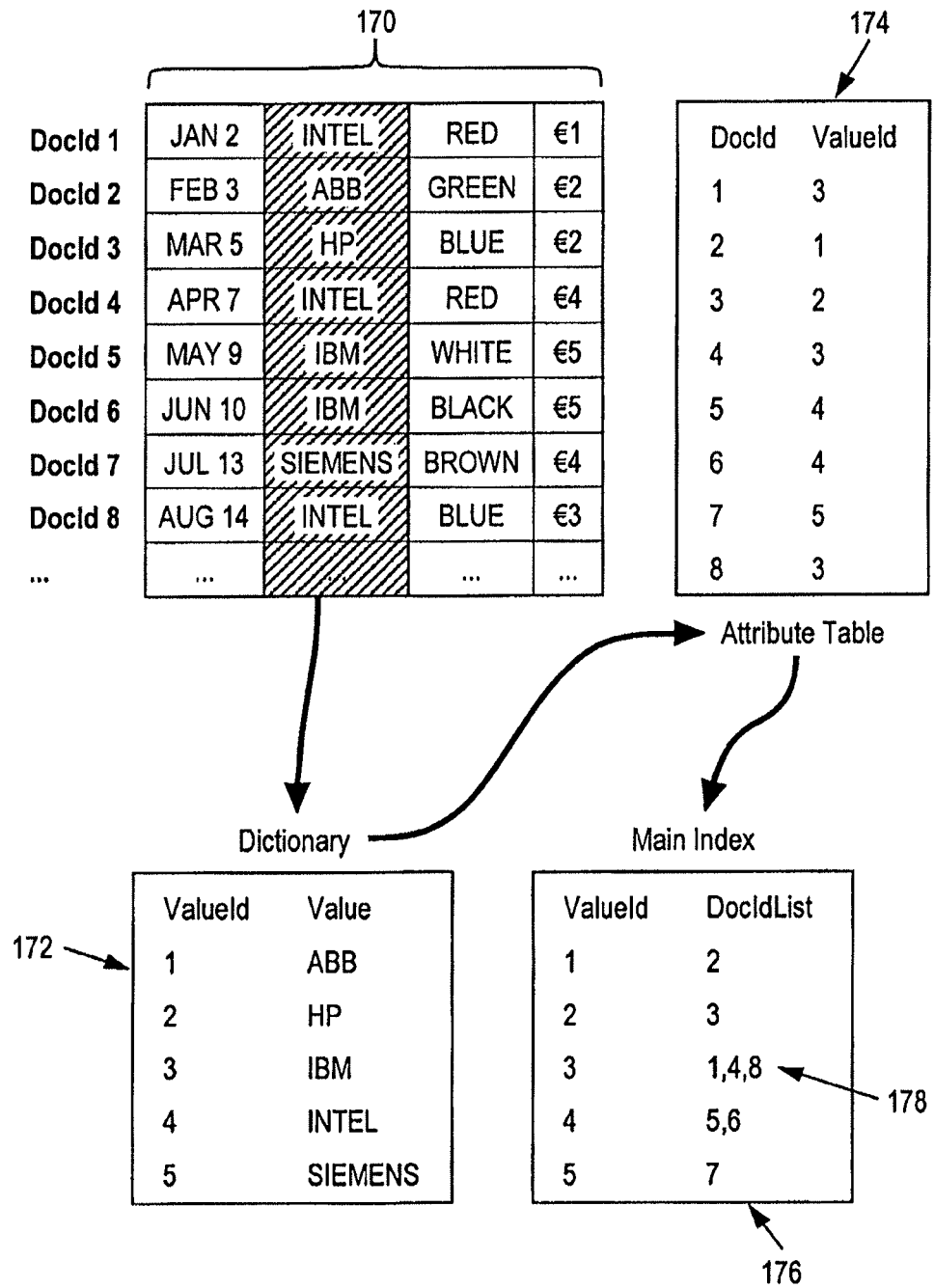
FIG. 1B is a block diagram illustrating a table of structured data, a dictionary for a column of the table, an attribute table, and a delta index.

FIG. 1B is a block diagram illustrating a table 170 of structured data, a dictionary 172 for a column of the table, an attribute table 174, and a delta index 176. In general, features of the block diagram of FIG. 1B may operate similarly to features of FIG. 1A. For example, both of the tables 105, 170 store records that may be compressed with dictionary-based compression using the dictionaries 110, 172 of FIGS. 1A and 1B, respectively, as described above.

In contrast to the block diagram of FIG. 1A, the block diagram of FIG. 1B includes the delta index 176, which may be used to store changes, which may include additions, modifications, or deletions, to data of a column. In particular, the delta index 176 includes a result of changes to data in a compressed column. The dictionary values of the delta index 176 may be chronologically ordered, as may be a case of a typical delta index. The chronological order may reflect an ordering of changes made to data over time, as indicated by associations of the values in the delta index 176 with indicated document identifiers. For example, the list 178 of document identifiers 1, 4, and 8, which are associated with the value identifier 3 may indicate that document identifier 1 was added before the document identifier 4, which was added before the document identifier 8. The chronological ordering of dictionary values of the delta index 176 may advantageously enable incremental writes without revision of previous entries.

The table 170 of FIG. 1B may reflect changes to, or deltas of, the table 105 of FIG. 1A. For example, each of the rows, of the table 170 corresponding to the delta index 176 may represent a row to add to the table 105 corresponding to the main index 120. As another example, where a row in the table 170 has a same record identifier as a row of the table 105, the row in the table 170 corresponding to the delta index 176 may represent a replacement of the row in the table 105. As another example, a row in the table 170 may represent a difference between a row having a same record identifier in the table 105 (e.g., a positive or negative incremental difference in values in various columns of a same record).

Implementations of the delta index 176 may differ. For example, although FIG. 1B shows the delta index 176 as including dictionary-based compression of delta values, that need not be the case.

FIG. 1C is an example illustrating generation of result sets from main and delta indexes. For example, the delta index 176 may be used in conjunction with an index of compressed data of a column (e.g., such as the main index 120 of FIG. 1A), where the delta index 176 may store changes to data in the index. Both the delta index 176 and an index of compressed data of a column may be searched and results from the two sources may be merged to produce a composite result which reflects the changes made to the compressed data (e.g., as discussed below with reference to a delta buffer).

In the example, total revenue for a company (labeled "IBM") is calculated by finding the total revenue from the main index and incrementing it with the total revenue from the delta index. In particular, the command 180 "RETURN TOTAL REVENUE FOR IBM SALES" may be broken into two operations, by a server program, where the two operations include a first operation 182 for revenue for IBM from a main index (rows 5 and 6 of FIG. 1A correspond to a value identifier of 3, for "IBM," in the main index, having a total value of 11 euros) and a second operation 184 for revenue for IBM from a delta index (rows 5 and 6 of FIG. 1B correspond to a value identifier of 4, for "IBM," in the delta index, having a total value of 10 euros). And, results from those two operations may be merged by an operand 186, where merging may include incrementing the results of the main index with the results of the delta index. Increments may be positive or negative. Updates to entries in the main index may be handled by first canceling an old row then inserting the updated row, where the cancellation can in one implementation be represented by a negative increment in the delta index and the insert by a positive increment.

Figure 2A:
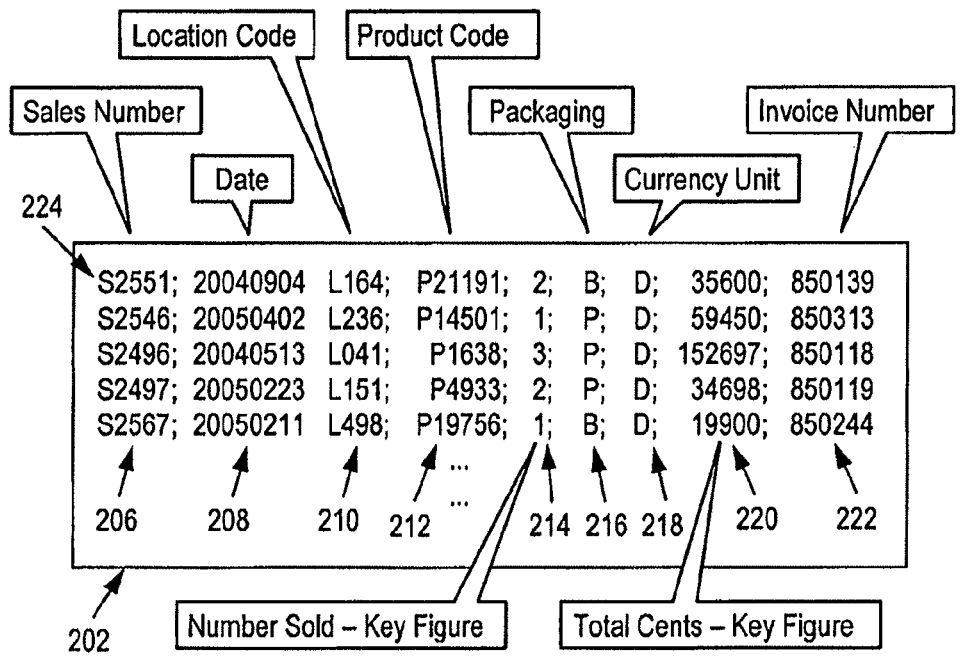
FIGS. 2A-2B are block diagrams illustrating tables of structured data.
Figure 2B:
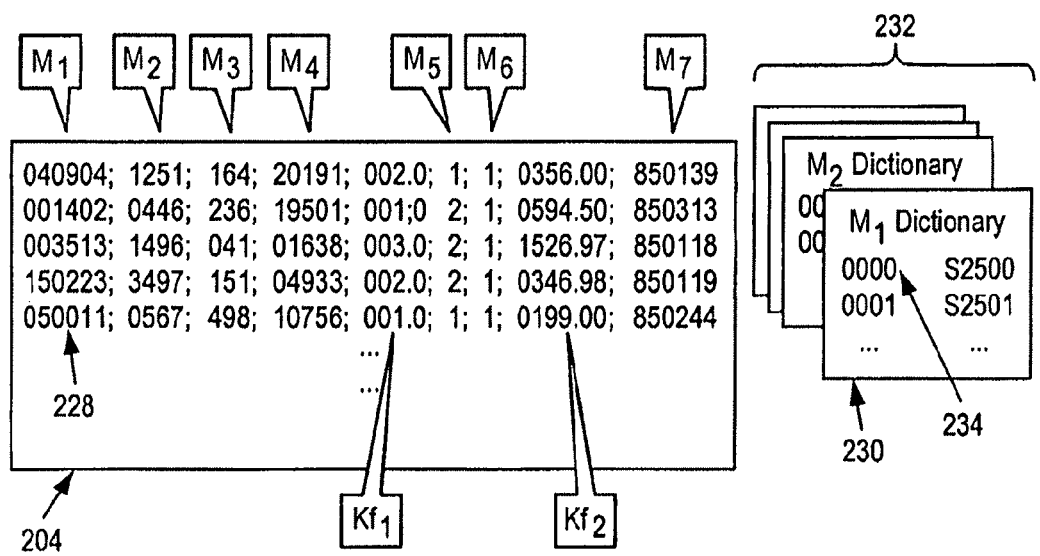

FIGS. 2A-2B are block diagrams illustrating tables 202, 204 of structured data. In general, a first table 202 represents an implementation of a sales table not being compressed according to dictionary-based compression and a second table 204 represents and implementation of the first table 202 being compressed in accordance with dictionary-based compression.

The first table 202 includes columns representing different types of data and rows representing different records based on a combination of the different types of data. For example, the columns represent sales numbers 206, dates 208, location codes 210, product code 212, a number of products sold 214, packaging attributes 216, a currency unit 218, a total value in cents 220, and an invoice number 222. The first row 224 includes a combination of information being a record, including, a sales number S2551, a date of 20040904, a location code of L164, a product code of P21191, and the like.

The second table 204 represents values of the columns 206-222 of the first table as dictionary-based compressed values. The types of compressed values include attributes, but not key figures (for reasons that may be irrelevant to compression of the values), and attributes are represented by identifiers in dictionaries 232. For example, values of the sales numbers 206 of the first table 202 are compressed as six digit integer values (which for up to about 250 thousand values may be represented by eighteen bit integer identifiers) in the first column 228 of the second table 204, where those integer values may represent a value in a first dictionary 230 but the number sold key figure values 214 of the first table 202 are not represented in a dictionary (and are represented as floating-point numbers for reasons that need not be relevant to compression of the values). A first sales identifier 0000 in the first dictionary 230 represents a value S2500 of the first column 228 of the second table 204.

Although FIGS. 2A-2B include a certain type of dictionary-based compression, such compression may differ. For example, although in the second table 204 of FIG. 2 key figures are not compressed according to dictionary-based compression, in some implementations a combination of key figures and attributes may be compressed according to dictionary-based compression, only key figures may be compressed, or a combination of select key figures and attributes may be compressed.

Figures 3, 4A:
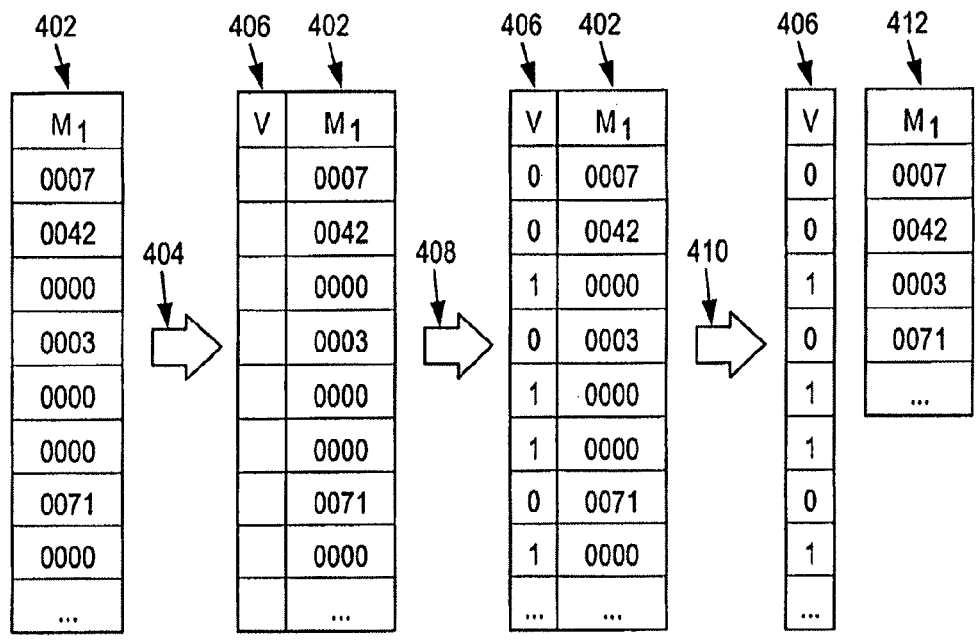
FIG. 3 is a table illustrating a cardinality of attributes and key figures.
FIGS. 4A-4B are block diagrams illustrating columns being compressed according to vector-based compression.

FIG. 3 is a table 300 illustrating cardinalities of attributes and key figures. For example, the table 300 may include a listing of cardinalities of respective columns of the first and second tables 202, 204 of FIGS. 2A, 2B. In addition to illustrating cardinalities, the table 300 includes for each cardinality the number of bits required to code the respective columns. For example, the number of bits required to code column M_3 of cardinality 3 is 2, since 2 to the second power is 4, which is the smallest integral power of 2 that is greater than or equal to 3.

The columns of the table 300 include a first column 305 identifying a column of another table, a second column 310 indicating cardinalities of values in associated columns, and, a third column 315 indicating numbers of bits required to code associated columns based on associated cardinalities. For example, a first entry 325 of the table 300 indicates that a column of attributes identified as M_1 has a cardinality of twenty four, which requires five bits to code in binary (since two to the fifth power is the smallest integral power of two that is greater than or equal to twenty four).

The table 300 may be used to reduce a memory impact of a table by generating column widths of values based on cardinalities of their values, which may be used in combination with dictionary-based compression.

Figure 4B:
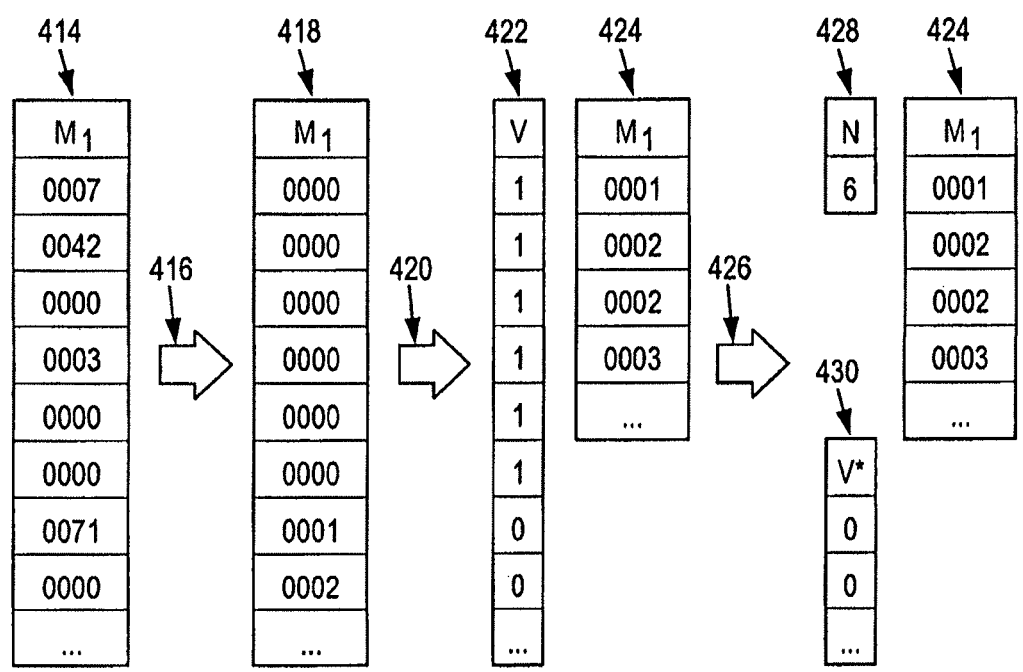

FIGS. 4A-4B are block diagrams illustrating columns being compressed according to vector-based compression. The compression may be referred to as bit vector compression. In general, the compression may involve finding a most frequent value in a column and representing the occurrence or non-occurrence of the value using a bit vector for the column. For example, a one may represent an occurrence of the value and a zero may represent a non-occurrence of the value. The compression may further involve generating a number of occurrences of a frequently occurring value and removing occurrences of the frequently occurring value from the bit vector to generate a smaller or reduced bit vector. For example, in contrast to the series of block diagrams in FIG. 4A, the series of block diagrams in FIG. 4B further includes reducing a bit vector of sorted values to a number of occurrences of a frequently occurring value and a shortened bit vector representing other values. The values in the columns of FIGS. 4A-4B may be dictionary-based compression values.

In the first series of block diagrams of FIG. 4A, a bit vector 406 is generated for a column 402 of values, as indicated by the first arrow 404. The bit vector 406 is populated with zeros and ones, as indicated by the second arrow 408, with zeros representing a non-occurrence of a frequently-occurring value 0000 and one representing an occurrence of the value. The frequently occurring value that is used to populate a bit vector may be a most-frequently occurring value or just a value that occurs more frequently than other values. Determining whether a value occurs frequently may be based on a tally of values from a scan of a column of data, or, statistical analysis of a value expected to occur most frequently (e.g., a null value may be expected to be a most-frequently occurring value in a table of exceptions where only exceptional values are non-null). The scope of occurrence for determining whether a value occurs frequently may be limited to a column of data (i.e., frequently occurring values may differ on a column by column basis). The column 402 of values may be compressed, as indicated by the third arrow 410, by removing occurrences of the most-frequently occurring value. For example, the value 0000 is removed from the column 402 to generate a compressed column 412. To reconstitute values from the column 402 based on the compressed column 412, the bit vector 406 may be used to indicate positions of values in the compressed column 412 and positions of a frequently occurring value.

For example, once dictionary-based compression has been performed, further compression can be achieved by deploying bit vectors for relevant columns as follows. For a given column A containing a frequently repeated value, such as a null value, a most frequent value F may be found in column A and coded using a bit vector V for the column. The bit vector V may have N terms, where N is a positive integer representing a number of rows in column A. If V is written as a column beside column A, V may include a 1 beside each appearance of value F in A and a 0 beside any other row in A. The bit vector V may be separated from the column vector A and all rows including value F may be deleted from A to generate a compressed column vector A*. The column A may be reconstituted from the compressed column vector A* by reinserting values F as specified by the bit vector V, and the uncompressed column of readable values can be reconstituted from A by using a dictionary as specified through a dictionary-based compression technique.

As an example of how reduction in memory may be realized, for an example table T with N equal to 1,000,000 rows and having a column A, let the most frequent value F in column A appear 990,000 times in A. The other 10,000 values in A may be taken from the remainder of the set of different values listed in the dictionary for A, which may contain a total of C being 250 different values. In this example, the bit vector V for column A may contain 1,000,000 bits, which is about 1 megabit, which is about 125 kilobytes. A compressed column A* may include 10,000 entries, where each is coded with 8-bit (i.e., 1 byte) integers, to give a space occupancy of 10 kilobytes (i.e., 10,000 entries×1 byte). A total space required by column A without compression may be 50 MB (as discussed with reference to a non-compressed example column A). A total space required with vector compression may include space for a dictionary, space for the compressed column A*, and space for the bit vector V. Total space required by a vector-based compression version of column A may be 147 kilobytes (12 kilobytes for the dictionary, 10 kilobytes for a compressed column, and 125 kilobytes for a bit vector). A compression factor of about 340 may be realized (i.e., 50,000 kilobytes uncompressed/147 kilobytes compressed in accordance with a vector-based compression implementation).

In contrast to the first series of block diagrams of FIG. 4A, the second series of block diagrams of FIG. 4B involves sorting a column of data to assist in generating an amount representing a number of occurrences of a frequently occurring value. In the second series of block diagrams of FIG. 4B, a sorted version of a column 414 is generated as shown by a first arrow 416 to the sorted column 418. Then, a frequently occurring value is represented by a bit vector 422 and the sorted column 418 has the frequently occurring value replaced, as shown by a second arrow 420 to the bit vector 422 and the reduced column 424, which has a frequently occurring value 0000 removed. A number 428 representing an amount of occurrences of a frequently occurring value is generated as shown by a third arrow 426. In addition, the bit vector 422 is reduced to remove a grouping of the frequently occurring value to generate the reduced, or shortened, bit vector 430. As some data might not be sorted to the front or top of bit vector 422, the shortened bit vector 430 may be used to determine whether a frequently occurring value occurs later in the reduced column 424. For example, dependencies among data across various columns, sorting rules, or a combination of factors might prevent a value of a column from being sorted to a grouping of a frequently occurring value. To reconstitute a full column, the number 428 of occurrences of the value in a grouping and the shortened bit vector 430 may be used, in combination with the reduced column 424.

For example, once a table has been compressed by means of dictionary-based compression and vector-based compression, a further level of compression may be possible in cases where many columns have many instances of frequently occurring values (e.g., many null or zero values). Rows in the table may be sorted to bring as many of the most-frequently occurring values in columns to a top of their columns as possible (e.g., as described with reference to table 600 of FIG. 6), and bit vectors may be generated for the columns. The topmost blocks of frequently occurring values may be replaced in the bit vectors by numbers recording how often frequently occurring values appear in the blocks (e.g., as shown by the number 428 of FIG. 4B). The use of the number may allow for bit vectors to be shortened and an increase of an overall compression ratio.

As a more detailed example, an example table T may have M columns with a most-frequently occurring value in column 1 being $F\_1$, a most-frequently occurring value in column 2 being $F\_2$, and the like to $F\_M$, where a number of occurrences of a value $F\_J$ in a column J may be written as $|F\_J|$ and the column J may be any of the columns (i.e., any of the columns from 1 to M). The columns may be numbered such that a column ordering is given by the frequency of the most frequent values F, so that the column with most F values is first and the column with fewest F values is last. Thus, columns 1 to M may be numbered such that $|F\_1|>|F\_2|>\ldots>|F\_M|$ (e.g., as may be the numbering of columns 602 in table 600 of FIG. 6).

The rows of table T may be sorted by column 1 such that all values $F\_1$ are on top. The sort order may be indifferent to an internal ordering of the top $|F\_1|$ rows, which may be sorted by column 2 such that all values $F\_2$ are on top. The sort order may now be indifferent to an internal ordering of the top block of rows with value $F\_2$, such that these rows are sorted by a column 3 such that all values $F\_3$ are on top. The sorting of rows may continue until a topmost block of rows with value $F\_(M-1)$ are sorted to put values $F\_M$ on top (e.g., continued for all but the last column M). All the $F\_1$ rows may be on top, with a large number of the $F\_2$ rows on top, somewhat fewer $F\_3$ rows on top, and so on, with decreasing completeness (e.g., as depicted in table 600 of FIG. 6). This manner of sorting might not be a theoretically optimal sorting for maximizing a final compression ratio, but may be relatively easy to implement, such that it runs faster than a more complex approach (e.g., more efficiently utilizes processing resources), and may often be close to an optimal sorting.

Follow the detailed example, bit vectors $V\_1$ to $V\_M$ may be written for the columns 1 to M, where each bit vector $V\_J$ for a column J includes '1' values for an occurrence of values $F\_J$ and '0' values for any other value. The result may be a set of bit vectors $V\_J$ that each start with a solid block of values $F\_J$. For each $V\_J$, the solid block of values $F\_J$ and write in their place a number $n\_J$ recording how many bits were deleted in $V\_J$. For sparse tables T (i.e., tables having a frequent occurrence of a most-frequent value where instances of the value are not necessarily adjacent), space occupied by a shortened bit vectors $V*\_J$ plus the numbers $n\_J$ may be significantly less than space occupied by a full bit vectors $V\_J$.

Shortened vector-based compression may greatly improve efficiency of aggregation of columns of values. For example, in cases where all the frequent values $F\_J$ are zero, aggregating the values of initial segments with a length $n\_J$ of the columns may be trivial (e.g., as $n\_J \times zero$ is zero), and code exploiting this triviality may be much cleaner and faster than would have been the case without the shortened vector-based compression.

As an example of how much compression may be realized, let a table T again be as described above, with N being 1,000,000 rows; the table having 10 columns $A\_1$ through $A\_10$; a most frequent value $F\_1$ in column $A\_1$ appearing 990,000 times; and another 10,000 values in $A\_1$ containing a total of 250 different values, each at 1 byte. Without shortened vector-based compression, but with vector-based compression column $A*\_1$ for a most-frequently occurring value $F\_1$ may occupy 10 kilobytes and a bit vector $V\_1$ may occupy 125 kilobytes.

With shortened vector-based compression, a shortened bit vector $V*\_1$ may contain 10,000 bits and occupy 1.25 kilobytes. The number $n\_1$ representing the block of 1 bits for $V\_1$ for the sorted column $A\_1$ may be in decimal notation 990,000 and require 20 bits in binary notation (i.e., less than 3 bytes). Total space required by $A\_1$ compressed with shortened vector-based compression may include space for a dictionary, space for the short column $A*\_1$, space for the short bit vector $V*\_1$, and space for the number $n\_1$. So the space for $A\_1$ with shortened vector-based compression may be less than 27 kilobytes (12 kilobytes, 10 kilobytes, 1.25 kilobytes, and 3 bytes).

As described above, total space required by a column $A\_1$ without compression may be 50 megabytes. With shortened vector-based compression, a compression factor may be greater than 1800 (50,000 kilobytes/27 kilobytes, suitably rounded). Compression factors for other columns having shortened vector-based compression, such as columns $A\_2$ to $A\_10$ may be less, depending on how many of the values $F\_J$ for J being from 2 to 10 are sorted to the tops of their columns, but for sparse tables the overall compression factor can still be high enough to make such compression well worthwhile, even allowing for the overhead code required to reconstruct the columns and read out selected values on demand.

For both vector-based compression and shortened vector-based compression, some overhead resource consumption (including but not restricted to processing and memory consumption) may be required to compress and decompress columns, and to facilitate efficient reads of values in a column without decompressing an entire column. The additional overhead may take both space (including but not restricted to main memory space) and time (e.g., measured in terms of percentage utilization of processor core resources) to run, and the penalty might be considered in setting thresholds for an employment of shortened vector-based compression (e.g., in contrast to vector-based compression, dictionary-based compression, or neither). The thresholds may be set heuristically and by testing on various tables. In implementations involving tables containing mass amounts of data, a selection of compression techniques may be used (e.g., different techniques for different columns) to minimize memory consumption in lieu of processing consumption. By minimizing memory consumption, fewer hardware resources, such as a number of blade servers and an amount of installed physical memory, may be required. In addition, overall speed of compressing data and responding to queries may be improved as a minimal memory footprint may allow for compressing and searching of data in main memory (e.g., volatile memory, such as random-access memory, having a response time quicker than a secondary memory, such as a hard disk drive used for persistent storage), and processing overhead for implementing compression may be acceptably small.

FIG. 5 is a block diagram illustrating a system 500 to compress data and search compressed data. The system 500 includes a search engine management tool 502, hosts 504, and storage 506. In general the system 500 may be used to search compressed data of the hosts 504 using the search engine management tool 502, and the data may be organized and compressed by the hosts 504. In addition, the data held in memory at the hosts 504 may be persisted at the storage 506, in either compressed or uncompressed form. The search engine management tool 502 may be an integrated service with the services that perform searching and compression, implemented redundantly on each of the hosts 504 (for example in such a manner as to provide mutual monitoring and backup).

The hosts 504 may be organized such that each of the hosts 504 holds a portion of rows of data. For example, a first host 508 may hold a first million rows and a second host 510 may hold a second million rows. Distribution of rows of data across the hosts 504 may be uniform, which may improve parallel processing. For example, this may be done to improve parallel processing to decompress, search and recompress rows of data across the hosts 504. As a result of the distribution of data, each column of a series of columns from one to M, with M being a positive number, may be split into parts one through N, with N being a positive integer, and one part being allocated to each host where each host is responsible for the portion allocated to that host (e.g., responsible for indexing and compression or for decompression, search and recompression of an allocated portion).

A logical index for a table of data may be stored at one of the hosts 504 and that logical index may be used to determine where data resides across the hosts 504 and to coordinate processing. For example, the first host 508 includes a logical index 518 that may indicate where rows of data are located across the hosts 504. As an example of coordinating processing, the search engine management tool 502 may query the first host 508 for results responsive to a search and the first host 508 may use the logical index 518 to coordinate searching of the hosts 504 and merging results to provide to the search engine management tool 502.

The hosts 504 may be blade servers that share the storage 506. The storage 506 may include an index, such as a first index 512, corresponding to each of one or more tables from a database for which the data is compressed at the hosts 504. For example, the tables may be fact tables and dimension tables for a multidimensional OLAP (OnLine Analytical Processing) cube. The indexes may contain a logical index with metadata for an index structure and a set of compressed columns. For example, the first index 512 includes a logical index 514, which may include metadata for the data of the hosts 504, and a set of compressed columns 516.

Each of the hosts 504 may be responsible for compressing rows of data for which they are responsible. For example, the first host 508 may be responsible for compressing rows of data in the compressed columns 520. The compression that is performed may be any of the types of compression described in this document. A compression scheme, such as shortened vector-based compression, may be stored with each index at a host and coordinated by a logical index in the case of a split index.

Each of the hosts 504 also includes a delta buffer. For example, the first host 508 includes a first delta buffer 522. The delta buffers may store any changes to a respective index part of a host. For example, the first delta buffer 522 may store changes to data stored in the columns 522 of data for a first part of a table. The delta buffers may be used to store changes to data in the hosts 504 instead of requiring updates to the data in response to each change (e.g., updates may be asynchronous to avoid hampering performance during queries on the data). That the compressed columns need not be updated for individual changes may allow for compression to improve overall system performance to a greater degree than if changes were written synchronously to the stored columns. For example, processing overhead associated with integrating updates may be reduced if updates are accumulated in the delta buffers and the accumulated updates used to update the main indexes on a less frequent basis, since then the overhead resources for compressing the updated main index are also consumed on a less frequent basis. For example, instead of making a thousand small updates to a column index and having to decompress and recompress the index each time, the thousand updates can be written to the delta buffer and then all written together to the main index, so that only one cycle of decompression and recompression is required, thus achieving a thousand-fold reduction in overhead resource consumption. To find search results, the delta buffer may be searched along with the compressed data in a main index and results from the delta buffer may be merged with results from the main index to generate results that incorporate changes. In some implementations, depending on implementation and configuration details, each of the hosts 504 may also include one or more delta buffers, for example, a delta buffer for each index.

FIG. 6 is a block diagram of a table 600 illustrating a sorting of data across multiple columns 602. Each of the rows 604 includes values that are dependent across the columns 602. For example, a first row 608 includes a combination of values for structure data that represents a business object where each of the values in the first row 608 are dependent on other values in the first row 608 such that a sorting of the first column 610 sorts data in the other columns such that the combination of the values of the first row 608 is maintained. The business objects may be modeled as sets of joined tables. The modeling as a set of joined tables may be a result of business objects being defined in such a way that they can be modeled as sets of joined tables, so a search engine may manipulate the objects by searching over rows of the tables and calculating specified joins of the business objects.

The data in the table 600 may be dictionary-based compression values. The data in the table 600 may be a result of a sorting the data to group most-frequently occurring values in preparation of a vector-based compression technique. For example, the value 0 may be a most-frequently occurring value for each of the columns 602 and the rows may have been sorted such that groupings of the value are generated at a top most portion of the columns 602.

The sorting of the rows 604 in the table 600 may have taken into account a most-frequently occurring value across the columns 602. For example, a summation row 606 indicates a number of occurrences of a most-frequently occurring value for each of the columns 602. The columns 602 may have been ordered such that a most-frequently occurring value of the first column 610 occurs more frequently than other frequently occurring values of each of the columns 602, and, most-frequently occurring values of other columns are also ordered such that values occurring more frequently across the column are ordered from A_2 to A_9. Based on a sorting of columns, the rows may be sorted to generate as many frequently occurring values in groups at one end of a row, and that sorting may take into account dependencies across columns.

For example, the columns may be ordered horizontally as A_1 to A_9 by how many 0 values they contain, as shown by the summation row 606. The first column 610, labeled column A_1, may have all of its rows sorted to bring all the 0 values to the top. Then, a second column 612, labeled column A_2, may have rows 1 to 19 sorted to bring the 0 values of those rows to the top. The sorting of the second column 612 being restricted to rows 1 to 19 may be based on maintaining the sorting order of the top most values of the first column 610 and dependencies of data across a row of data. For example, as rows 1 to 19 of the first column 610 includes the most-frequently occurring value of that column, to maintain the grouping of the most-frequently occurring value in rows 1 to 19, only those rows may be sorted in the second column 612. This technique of sorting may be followed for each of the remaining columns. For example, the third column 614, labeled column A_3, may have rows 1 to 15 sorted to bring 0 values of those rows to the top, where 0 values of other rows may maintain their position (e.g., row 17 includes a 0 value). As other examples, a fourth column 616, labeled column A_4, may have rows 1 to 14 sorted to bring 0 values to the top of those rows; a fifth column 618, labeled column A_5, may have rows 1 to 10 sorted to bring 0 values of those rows to the top; a sixth column 620, labeled column A_6, may have rows 1 to 8 sorted to bring 0 values of those rows to the top; a seventh column 622, labeled column A_7, may have rows 1 to 7 sorted to bring 0 values of those rows to the top; an eight column 624, labeled column A_8, may have rows 1 to 6 sorted to bring 0 values of those rows to the top; and, a ninth column 626, labeled column A_9, may have rows 1 to 4 sorted to bring 0 values of those rows to the top.

Each of the sorted columns may be compressed using vector-based compression, such as the shortened vector based compression described with reference to FIG. 4B. The sorting of columns may optimize memory savings of compression by pushing larger blocks of frequently occurring values to one end of a column, such that, for example, shorter bit vectors may be generated with the sorting than may be generated without such sorting.

Although the table 600 includes a certain organization of data that may be a result of a sorting, sorting may differ and the data may differ. For example, although a same value, 0, is a most-frequently occurring value for each of the columns 602, tables may differ and different values may be a most-frequently occurring value for each of the columns 602. As another example, a most-frequently occurring value for one column may be used for sorting all of the columns, or all of the columns need not be sorted.

Figure 7A:
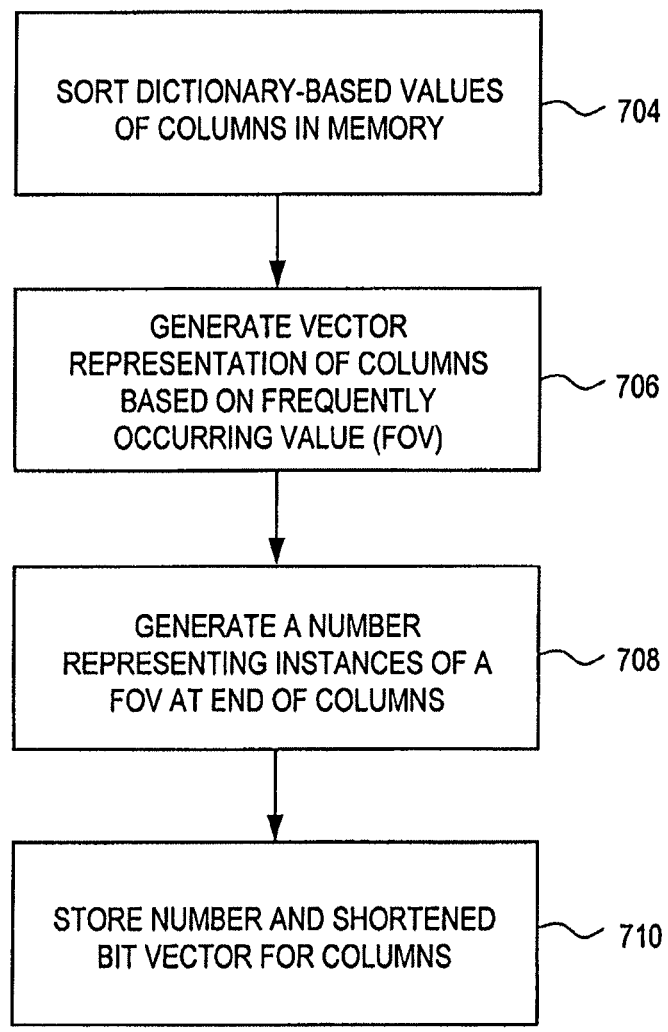
FIGS. 7A-7B are flowcharts illustrating processes of compressing data and enabling searches of compressed data.
Figure 7B:
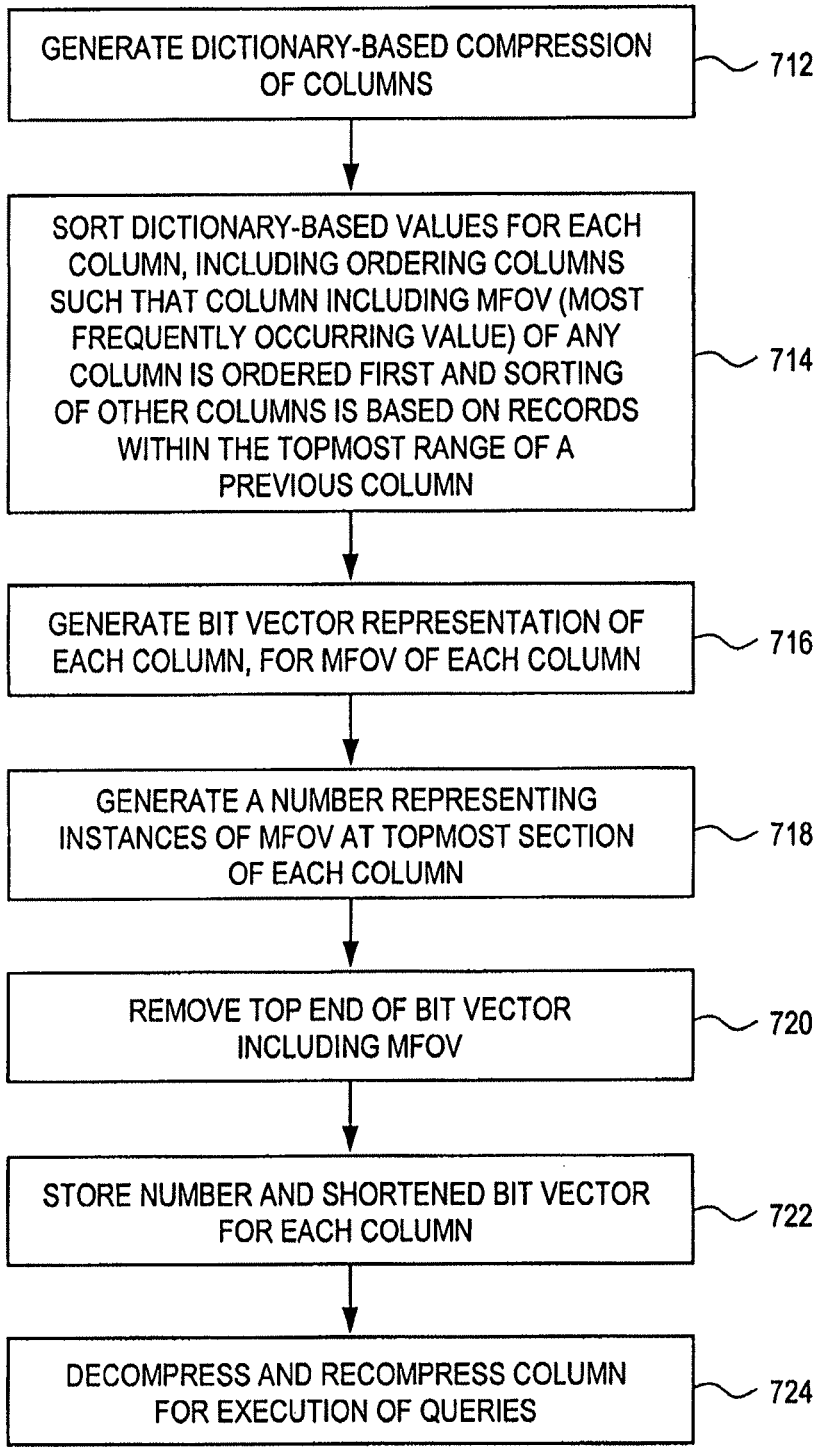

FIGS. 7A-7B are flowcharts illustrating processes 700, 702 of compressing data and enabling searches of compressed data. The processes 700, 702 may be implemented by the hosts 504 of FIG. 5. For example each of the hosts 504 may perform the process 700 on a portion of data for which a host is responsible. The data that is compressed may be structured business data. The data may be compressed and searched in memory, as significant compression of the data may allow for cost-effective in-memory processing of the data (e.g., a number of servers or an amount of physical memory may be reduced).

In general, in the process 700 of FIG. 7A, dictionary-based values of columns of data in memory are sorted (704), vectors representing frequently occurring values of the columns are generated (706), numbers representing frequently occurring values are generated (708), and the numbers and shortened vectors are stored (710).

Sorting of dictionary-based values (704) may involve sorting from a lowest value to a higher value for one or more columns of values. If values of multiple columns are sorted, the sorting may involve sorting some columns before others based on an ordering of columns (e.g., an ordering based on a number of most-frequently occurring values in columns of a table). For example, the sorting of columns 602 based on the order of the columns 602 described with reference to the table 600 of FIG. 6 may be performed. The sorting may take into account dependencies of data across columns. For example, the dictionary-based values may represent data that is structured with dependencies across columns for a same row and an association of values in a row may be maintained. The sorting may take place in a server, such as one of the hosts 504 of FIG. 5.

For example, sorting dictionary-based values may involve, for each column of a table, ordering columns such that a column including a most-frequently occurring value (MFOV) of any column is ordered first and sorting of other columns is based on records within the topmost range of a previous column (714).

Vectors representing frequently occurring values of the columns are generated (706). The vectors may be bit vectors that represent the occurrence or non-occurrence of a frequently occurring value in a row with a bit. The vectors may be generated for all of the columns or for only some of the columns. The vectors may be generated for parts of a column by each server responsible for a portion of data (e.g., respective hosts of the hosts 504 of FIG. 5). A frequently occurring value might be, but need not be, a most-frequently occurring value, such as a most-frequently occurring value within a scope of a column. For example, a bit vector representation for a most-frequently occurring value of each column may be generated (716).

Numbers representing frequently occurring values are generated (708). Each of the numbers may represent a number of occurrences of a frequently occurring value in a column. For example, FIG. 4B includes a number six (428) indicating six occurrences of a frequently occurring value 0000. The number of occurrences may be limited to a number of occurrences in a group of the frequently occurring value at one end of a column (e.g., at a top or bottom). For example, one column may have a group of a frequently occurring value at a top, the number may represent the number of occurrences of the value in that group, and the column may include other instances of the value. For example, a number representing instances of a most-frequently occurring value at a topmost section of each column may be generated (718).

Numbers and shortened vectors are stored (710). For example, the number representing occurrences of a frequently occurring value may be stored with a shortened vector. For example, a set of a number and a bit vector may be stored for each column of a table. The shortened vector may be a vector representing occurrences of the frequently occurring value with the occurrences of the value represented by the number removed from the vector to generate the shortened vector. In addition to storing the shortened vector, instances of the frequently occurring value in the group of the value may be removed from a column to generate a shortened or reduced column. For example, top ends of bit vectors including most-frequently occurring values may be removed (720), and numbers representing the number of occurrences of most-frequently occurring values and shortened bit vectors for each column may be stored (722). Also, the top end of a column including a group of most-frequently occurring values may be removed or all instances (e.g., topmost and other instances, if any) of a most-frequently occurring value may be removed to generate a shortened column (and, e.g., may be reconstituted using the bit vector).

In general, in addition to implementations of sub processes of process 700 of FIG. 7A, the process 702 of FIG. 7B further includes generating dictionary-based compression values (712; e.g., as described with reference to FIG. 1A), shortening vectors representing values of columns (720; e.g., as described in the above paragraph), storing a compressed column in memory (722), and decompressing and recompressing a column as required to execute queries (724).

Performing a search on a compressed column may involve loading data of a compressed column into memory (e.g., non-volatile memory from compressed data in a persistent storage), decompressing the data to a temporary structure, and selecting rows as specified by the search.

Although the processes 700, 702 of FIGS. 7A and 7B include certain sub-processes in a certain order, additional, fewer, or different sub-processes may exist and those sub-processes may be in a different order. For example, a column may be sorted based on bit vector representations of most-frequently occurring values of a column, rather than sorting an entire column (e.g., only values most-frequently occurring may be sorted to one end of a column and other values need not have a sorting among them).

As another example, dictionary-based compression, general vector-based compression, and shortened vector-based compression may be applied based on determinations as to whether a type of compression, if any, is expected to optimize performance (e.g., reduce memory consumption). For example, dictionary-based compression might be performed if dictionary-based values and a dictionary are expected to consume less memory than non-dictionary-based values of a column. As another example, only rows having attributes but not key figures may be compressed using any type of compression.

Although each of the figures describes a certain combination of features, implementations may vary. For example, additional, different, or fewer components may be included in the system 500 of FIG. 5. As another example, in some implementations, a dictionary need not be used for a single column. For example, multiple columns may share a dictionary.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, i.e., one or more computer programs tangibly embodied in an information carrier, e.g., in a machine-readable storage device or in a propagated signal, for execution by, or to control the operation of, data processing apparatus, e.g., a programmable processor, a computer, or multiple computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Media suitable for embodying computer program instructions and data include all forms of volatile (e.g., random access memory) or non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other in a logical sense and typically interact through a communication network. The relationship of client and server arises by virtue of computer programs running on the respective computers and having a client-server relationship to each other.

The subject matter described herein has been described in terms of particular embodiments, but other embodiments can be implemented and are within the scope of the following claims. For example, operations can differ and still achieve desirable results. In certain implementations, multitasking and parallel processing may be preferable. Other embodiments are within the scope of the following claims

What is claimed is:

1. A non-transitory computer program product, tangibly embodied in a computer-readable medium, the computer program product being operable to cause data processing apparatus to perform operations comprising:
generating columns of dictionary-based compression values, the columns of dictionary-based compression values being based on a dictionary of possible values for each column of a column-based database and being structured business data;
sorting the columns such that a first column ordered first in an ordering of the columns has a most-frequently occurring value of the first column occurring more frequently than frequently occurring values of other columns, such that the sorted first column includes, at one end of the first column, instances of the most-frequently occurring value of the first column and the other columns include, at an end of each of the other columns, instances of most-frequently occurring values of the other columns;

generating a bit vector for at least one of the columns, each of the bit vectors representing most-frequently occurring values of a respective column, the generating comprising having each bit of the bit vector represent whether the most-frequently occurring value exists in a respective row of the respective column;

generating a number for each of the columns having an associated bit vector, the number representing an amount of occurrences of the most-frequently occurring value of one end of the column, wherein the most frequently occurring value comprises a plurality of bits;

removing from each of the bit vectors a representation of the most-frequently occurring value of one end of the respective column based on the number associated with the bit vector;

storing the number associated with each of the bit vectors to enable non-volatile memory searches of the data represented by the number associated with each of the bit vectors and each of the bit vectors; and generating a delta index separate from the columns and configured to store changes to at least one column that occur after the generation and storing of the compression values, wherein the changes include at least one of an addition, a modification, or a deletion to the at least one column, and wherein the stored changes are comprised of dictionary values and value identifiers assigned in an attribute table, the dictionary values being added to the delta index in chronological order to reflect an ordering of changes made to data in the columns over time.

2. The product of claim 1, wherein the dictionary-based compression values are values representing structured business data having data dependencies across a same row of a table.

3. The product of claim 2, wherein the business data comprises business objects modeled as sets of joined tables.

4. The product of claim 1, wherein the operations of the product are performed in parallel on a plurality of hardware servers.

5. The product of claim 4, wherein the operations further comprise removing the most-frequently occurring values from columns corresponding to the one or more numbers to generate reduced columns and storing the reduced columns in lieu of the columns.

6. The product of claim 1, wherein the bit vector is generated for each of the columns.

7. The product of claim 1, wherein the non-volatile memory searches comprises searching both the delta index and the compressed data.

8. A method comprising:
generating, by one or more processors, columns of dictionary-based compression values, the columns of dictionary-based compression values being based on a dictionary of possible values for each column of a column-based database and being structured business data;

sorting, by the one or more processors, at the one or more processors, the columns such that a first column ordered first in an ordering of the columns has a most-frequently occurring value of the first column occurring more frequently than frequently-occurring values of the other columns, such that the sorted first column includes, at one end of the first column, instances of the most-frequently occurring value of the first column and the other columns include, at an end of each of the other columns, instances of most-frequently occurring values of the other columns;

generating, by the one or more processors, a bit vector for at least one of the columns, each of the bit vectors representing most-frequently occurring values of a respective column, the generating comprising having each bit of the vector represent whether the most-frequently occurring value exists in a respective row of the respective column;

generating, by the one or more processors, from each of the bit vectors a representation of the most-frequently occurring value of one end of the respective column based on the number associated with the bit vector;

storing, by the one or more processors, the number associated with each of the bit vectors to enable non-volatile memory searches of the data represented by the number associated with each of the bit vectors and each of the bit vectors; and generating, by the one or more processors, a delta index separate from the columns and configured to store changes to at least one column that occur after the generation and storing of the compression values, wherein the changes include at least one of an addition, a modification or a deletion to the at least one column, and wherein the stored changes are comprised of dictionary values and value identifiers assigned in an attribute table, the dictionary values being added to the delta index in chronological order to reflect an ordering of changes made to data in the columns over time.

9. The method of claim 8, wherein values of the column represent structured business data having data dependencies across a same row of a table.

10. The method of claim 8, wherein the vector corresponds to the most-frequently occurring value of the column.

11. The method of claim 8 further comprising removing the frequently occurring value from the column to generate a reduced column and storing the reduced column in lieu of the column.

12. The method of claim 8, wherein the non-volatile memory searches comprises searching both the delta index and the compressed data.

* * * * *